US010186671B2

(12) United States Patent
Goto et al.

(10) Patent No.: US 10,186,671 B2
(45) Date of Patent: Jan. 22, 2019

(54) SEMICONDUCTOR LIGHT-EMITTING ELEMENT

(71) Applicants: STANLEY ELECTRIC CO., LTD., Meguro-ku, Tokyo (JP); THE UNIVERSITY OF TOKYO, Bunkyo-ku, Tokyo (JP)

(72) Inventors: Meiki Goto, Tokyo (JP); Masakazu Sugiyama, Tokyo (JP); Mathew Manish, Tokyo (JP)

(73) Assignees: STANLEY ELECTRIC CO., LTD., Tokyo (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/525,056

(22) PCT Filed: Oct. 22, 2015

(86) PCT No.: PCT/JP2015/079805
§ 371 (c)(1),
(2) Date: May 6, 2017

(87) PCT Pub. No.: WO2016/072276
PCT Pub. Date: May 12, 2016

(65) Prior Publication Data
US 2017/0324048 A1    Nov. 9, 2017

(30) Foreign Application Priority Data

Nov. 7, 2014  (JP) ................................. 2014-226915

(51) Int. Cl.
*H01L 51/00*    (2006.01)
*H01L 33/24*    (2010.01)
(Continued)

(52) U.S. Cl.
CPC .......... *H01L 51/0082* (2013.01); *H01L 33/08* (2013.01); *H01L 33/20* (2013.01);
(Continued)

(58) Field of Classification Search
None
See application file for complete search history.

(56) References Cited

U.S. PATENT DOCUMENTS 10,043,944 B2    8/2018  Zhang et al.
2003/0151044 A1  8/2003  Yamada
(Continued)

FOREIGN PATENT DOCUMENTS

CN    102637795 A    8/2012
CN    103746052 A    4/2014
(Continued)

OTHER PUBLICATIONS

Machine translated document (2008).*
(Continued)

*Primary Examiner* — A. Sefer
(74) *Attorney, Agent, or Firm* — Holtz, Holtz & Volek PC

(57) ABSTRACT

A semiconductor light-emitting element including a first semiconductor layer of a first conductivity type; a light-emitting functional layer that includes first and second light-emitting layers; and a second semiconductor layer of a conductivity type opposite to the conductivity type of the first semiconductor layer. The first light-emitting layer has a first base layer with a composition subject to stress strain from the first semiconductor layer; a first quantum well layer that retains a segment shape of the first base segment; and a first barrier layer that has a flat surface flattened by embedding the first base layer and the first quantum well layer. The second light-emitting layer has a second base layer that has a composition subject to stress strain from the first barrier
(Continued)

layer; a second quantum well layer that retains a segment shape of the second base segment; and a second barrier layer.

16 Claims, 3 Drawing Sheets

(51) Int. Cl.
*H01L 33/20* (2010.01)
*H01L 33/36* (2010.01)
*H01L 33/62* (2010.01)
*H01L 33/08* (2010.01)
*H01L 33/32* (2010.01)
*H01L 33/06* (2010.01)
*H01L 33/18* (2010.01)

(52) U.S. Cl.
CPC ............ *H01L 33/24* (2013.01); *H01L 33/36* (2013.01); *H01L 33/62* (2013.01); *H01L 51/0081* (2013.01); *H01L 33/06* (2013.01); *H01L 33/18* (2013.01); *H01L 33/32* (2013.01)

(56) References Cited

U.S. PATENT DOCUMENTS

| | | |
|---|---|---|
| 2005/0056850 A1 | 3/2005 | Taki |
| 2006/0131595 A1 | 6/2006 | Chen |
| 2006/0267026 A1 | 11/2006 | Kim et al. |
| 2007/0145386 A1 | 6/2007 | Lee et al. |
| 2008/0073657 A1 | 3/2008 | Liang et al. |
| 2008/0191190 A1 | 8/2008 | Tsai et al. |
| 2009/0014713 A1 | 1/2009 | Kang et al. |
| 2009/0121214 A1 | 5/2009 | Tu et al. |
| 2009/0173955 A1 | 7/2009 | Kim et al. |
| 2010/0155704 A1 | 6/2010 | Oh et al. |
| 2010/0244042 A1 | 9/2010 | Saito et al. |
| 2010/0289043 A1 | 11/2010 | Aurelien et al. |
| 2011/0210312 A1 | 9/2011 | Tu et al. |
| 2011/0297955 A1* | 12/2011 | Wang ............... H01L 33/24 257/76 |
| 2012/0056157 A1* | 3/2012 | Hikosaka ............ B82Y 20/00 257/13 |
| 2012/0077298 A1 | 3/2012 | Liang et al. |
| 2012/0205618 A1 | 8/2012 | Nakamura |
| 2013/0313517 A1 | 11/2013 | Choi |
| 2013/0320299 A1 | 12/2013 | Li |
| 2015/0179791 A1 | 6/2015 | Kudou |
| 2016/0043279 A1 | 2/2016 | Jean et al. |
| 2017/0317232 A1 | 11/2017 | Togawa et al. |

FOREIGN PATENT DOCUMENTS

| | | | |
|---|---|---|---|
| EP | 2642536 A2 | | 9/2013 |
| JP | 2004179493 A | | 6/2004 |
| JP | 2005093682 A | | 4/2005 |
| JP | 2006339646 A | | 12/2006 |
| JP | 2008053608 A | | 3/2008 |
| JP | 2008071805 A | | 3/2008 |
| JP | 2008199016 A | | 8/2008 |
| JP | 2008218746 | * | 9/2008 |
| JP | 2009124149 A | | 6/2009 |
| JP | 2011249460 A | | 12/2011 |
| JP | 4984119 B2 | | 7/2012 |
| KR | 809229 | * | 3/2008 |
| WO | 2012059837 A1 | | 5/2012 |
| WO | 2013114152 A1 | | 8/2013 |

OTHER PUBLICATIONS

International Search Report (ISR) and Written Opinion dated Dec. 15, 2015 issued in International Application No. PCT/JP2015/079805.
Extended European Search Report (EESR) dated May 7, 2018 issued in counterpart European Application No. 15857240.4.
Applied Physics Letters 92, 261909 (2008).
U.S. Appl. No. 15/525,054; First Named Inventor: Yusaku Fujii; Title: "Semiconductor Light-Emitting Element"; filed May 6, 2017.
U.S. Appl. No. 15/525,055; First Named Inventor: Takado Fujiwara; Title: "Semiconductor Light-Emitting Element"; filed May 6, 2017.
U.S. Appl. No. 15/525,057; First Named Inventor: Hiroyuki Togawa; Title: "Semiconductor Light-Emitting Device"; filed May 6, 2017.
U.S. Appl. No. 15/561,028; First Named Inventor: Hiroyuki Togawa; Title: "Semiconductor Light-Emitting Element, and Manufacturing Method for Same"; filed Sep. 22, 2017.
Chinese Office Action dated Sep. 30, 2018 (and English translation thereof) issued in counterpart Chinese Application No. 20158006116.9.

\* cited by examiner

SEMICONDUCTOR LIGHT-EMITTING ELEMENT

TECHNICAL FIELD

The present invention relates to a semiconductor light-emitting element, such as a light-emitting diode (LED).

BACKGROUND ART

A semiconductor light-emitting element is usually manufactured by growing, on a growth substrate, a semiconductor structure layer composed of an n-type semiconductor layer, an active layer, and a p-type semiconductor layer and forming an n-electrode and a p-electrode that apply voltage to the n-type semiconductor layer and the p-type semiconductor layer, respectively.

Patent literature 1 discloses a light-emitting device produced by forming at least two types of semiconductor light-emitting elements on one substrate material and applying, to the respective semiconductor light-emitting elements, a plurality of types of phosphors that react to the respective light-emitting wavelengths of the semiconductor light-emitting elements. Patent literature 2 discloses a white light-emitting diode in which red, green, and blue light-emitting diodes are laminated in this order in order to emit light in the same direction. Patent Literature 3 discloses a white light-emitting element including: a first light-emitting portion bonded to a conductive sub-mount substrate by a metal layer; and a second light-emitting portion formed on one region of the upper surface of the conductive sub-mount substrate. Patent Literature 4 discloses a semiconductor light-emitting element including a plurality of well layers composed of InGaN in which the In compositions of the well layers are different.

CITATION LIST

Patent Literature

Patent Literature 1: Japanese Patent Application Laid-Open No. 2008-71805
Patent Literature 2: Japanese Patent Application Laid-Open No. 2011-249460
Patent Literature 3: Japanese Patent Application Laid-Open No. 2006-339646
Patent Literature 4: Japanese Patent Application Laid-Open No. 2004-179493

SUMMARY OF INVENTION

Technical Problem

Emission of light by a semiconductor light-emitting element is induced when binding (recombination) of an electron and a hole injected into the element through electrodes occurs in the active layer of the element. The wavelength of the light emitted from the active layer (i.e. light-emitting color) differs depending on the band gap of the semiconductor materials that make up the active layer. For example, a light-emitting element using a nitrite-based semiconductor emits blue light from its active layer.

A light source is required to have color rendering properties for, for example, lighting applications. A light source with high color rendering properties is a type of light source that emits near natural light. To achieve high color rendering properties, it is preferable that light emitted from a light source have a wavelength that substantially covers the entire wavelength of the visible region. For example, light extracted from a light source with high color rendering properties is observed as white light.

In this regard, as disclosed in the aforementioned patent literatures, various methods of using a semiconductor light-emitting element to acquire white light have been proposed. In one example method of manufacturing a light-emitting device, a wavelength conversion component, such as a phosphor, is mixed into a sealing resin to seal the element by the sealing resin. For example, in the case of a semiconductor light-emitting element using an active layer that emits blue light, a part of blue light from the active layer is converted into yellow light by a phosphor, and the two types of light are mixed and emitted to the outside. The emitted light as a whole is thus observed as white light. In another proposed technique, by laminating a plurality of active layers with different compositions, the light-emitting wavelength range is widened without using a phosphor.

However, a light-emitting device manufactured using the aforementioned methods has problems relating to the uniformity of the light-emitting wavelength within the device, the complexity of the manufacturing process, and light-emitting intensity. Possible reasons include: addition of a phosphor mixing step; change of the wavelength conversion efficiency of a phosphor over time, addition of a processing step of a semiconductor layer, and deterioration of crystallinity due to processing of a semiconductor layer.

The present invention has been made in view of the aforementioned problems. An object of the present invention is to provide a semiconductor light-emitting element that does not require a wavelength conversion member, such as a phosphor, and that has a light-emitting wavelength band (spectral width) over a wide range of the visible region and has high color rendering properties and a high light-emitting intensity.

Solution to Problem

A semiconductor light-emitting element according to the present invention includes: a first semiconductor layer of a first conductivity type; a light-emitting functional layer that is formed on the first semiconductor layer and includes first and second light-emitting layers; and a second semiconductor layer that is formed on the light-emitting functional layer and is of a conductivity type opposite to the conductivity type of the first semiconductor layer. The first light-emitting layer has: a first base layer that has a composition subject to stress strain from the first semiconductor layer and has a plurality of first base segments partitioned into a random net shape; a first quantum well layer that retains a segment shape of the first base segment and is formed on the first base layer; and a first barrier layer that has a flat surface flattened by embedding the first base layer and the first quantum well layer. The second light-emitting layer has: a second base layer that has a composition subject to stress strain from the first barrier layer and has a plurality of second base segments partitioned into a random net shape; a second quantum well layer that retains a segment shape of the second base segment and is formed on the second base layer; and a second barrier layer formed on the second quantum well layer.

DESCRIPTION OF EMBODIMENTS

Figure 1:
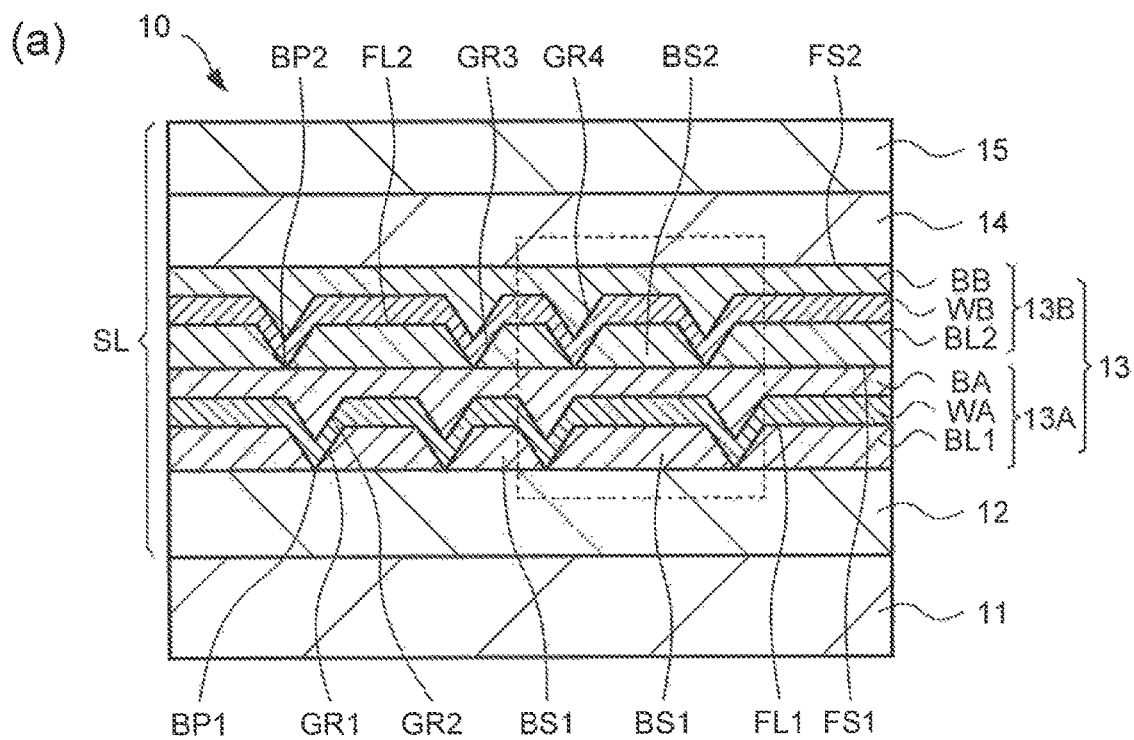
FIG. 1(a) is a cross-sectional view illustrating a structure of a semiconductor light-emitting element according to a first embodiment.
FIG. 1(b) is a schematic top plan view of a base layer of a first light-emitting layer.
Figure 1:
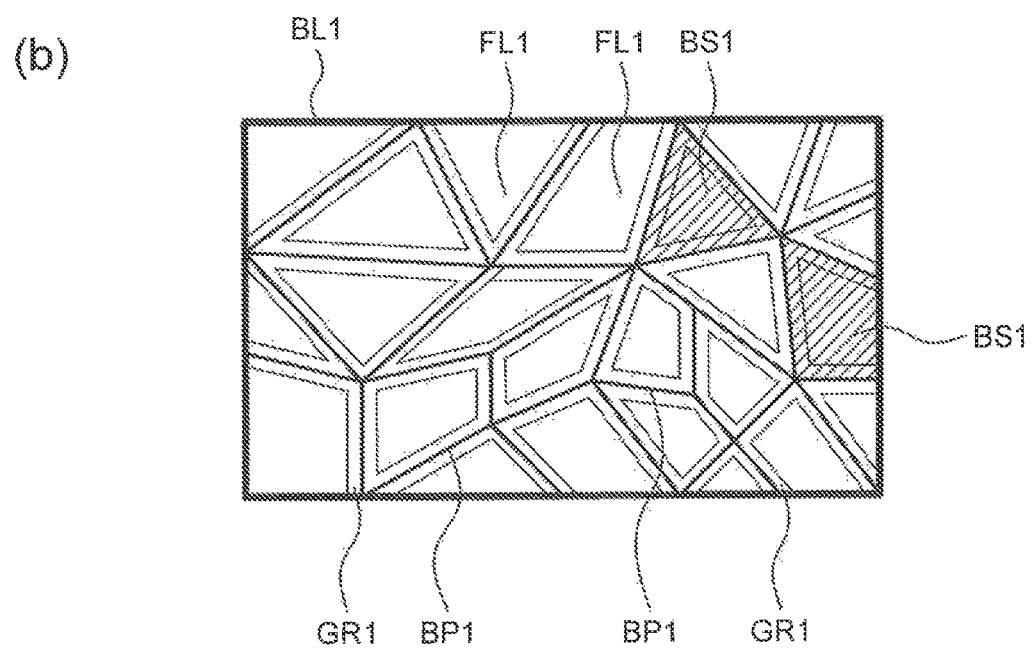

Embodiments of the present invention will now be described in detail hereinbelow. In this specification, an identical reference numeral is assigned to like constituent elements.

First Embodiment

FIG. 1(a) is a cross-sectional view illustrating a structure of a semiconductor light-emitting element (hereinafter, simply referred to as "light-emitting element" or "element" in some cases) 10 according to a first embodiment. In the structure of the semiconductor light-emitting element 10, a semiconductor structure layer SL is formed on a mounting substrate (hereinafter, simply referred to as "substrate" in some cases) 11. The semiconductor structure layer SL includes an n-type semiconductor layer (first semiconductor layer) 12 formed on the mounting substrate 11, a light-emitting functional layer 13 formed on the n-type semiconductor layer 12 and including first and second light-emitting layers 13A and 13B, an electron blocking layer 14 formed on the light-emitting functional layer 13, and a p-type semiconductor layer (second semiconductor layer, i.e. a semiconductor layer whose conductivity type is opposite to the conductivity type of the first semiconductor layer 12) 15 formed on the electron blocking layer 14.

According to the embodiment, the mounting substrate 11 is composed of a growth substrate used for growth of, for example, the semiconductor structure layer SL, and is made of sapphire, for example. In addition, the semiconductor structure layer SL is composed of a nitride-based semiconductor. The semiconductor light-emitting element 10 can be manufactured by growing the semiconductor structure layer SL on the sapphire substrate, for example, whose C-plane surface serves as a crystal growth surface, using the Metal Organic Chemical Vapor Deposition (MOCVD) method. Although not illustrated in the drawings, the light-emitting element 10 has an n-electrode and a p-electrode that apply voltage to the n-type semiconductor layer 12 and the p-type semiconductor layer 15, respectively.

The embodiment is illustrated with reference to the structure of the light-emitting element 10 where the semiconductor structure layer SL is formed on a growth substrate serving as the mounting substrate 11. However, the embodiment is not limited to the structure where the mounting substrate 11 is the growth substrate. For example, the semiconductor light-emitting element 10 may have a structure obtained by first growing the semiconductor structure layer SL on a growth substrate, bonding the semiconductor structure layer SL to another substrate, and removing the growth substrate. In this case, the other substrate thus bonded is formed on the p-type semiconductor layer 15. The aforementioned bonded substrate may use materials with a high degree of heat dissipation, such as, Si, AlN, Mo, W, and CuW.

Although not illustrated in the drawings, a buffer layer (underlayer) may be provided between the mounting substrate 11 and the n-type semiconductor layer 12. The buffer layer is, for example, provided for the purpose of mitigating the strain possibly generated on the interface between the growth substrate and the semiconductor structure layer SL as well as on the interface between layers of the semiconductor structure layer SL. In this embodiment, after a GaN layer is grown on a sapphire substrate (mounting substrate 11) as a buffer layer, the n-type semiconductor layer 12 is laminated.

The n-type semiconductor layer 12 is composed of, for example, a GaN layer containing an n-type dopant (for example, Si). The electron blocking layer 14 is composed of, for example, an AlGaN layer. The p-type semiconductor layer 15 is composed of, for example, a GaN layer containing a p-type dopant (for example, Mg). The n-type semiconductor layer 12 may be composed of a plurality of n-type semiconductor layers with different dopant concentrations. The electron blocking layer 14 may contain a p-type dopant. The p-type semiconductor layer 15 may have a contact layer on the principal surface opposite to the interface with respect to the electron blocking layer 14.

The light-emitting functional layer 13 has first and second light-emitting layers 13A and 13B. The first light-emitting layer 13A is formed on the n-type semiconductor layer 12, and the second light-emitting layer 13B is formed on the side of the p-type semiconductor layer 15 (on the first light-emitting layer 13A in this embodiment) with respect to the first light-emitting layer 13A. The electron blocking layer 14 is formed on the second light-emitting layer 13B. Each of the first and second light-emitting layers 13A and 13B has a quantum well (QW) structure.

The first light-emitting layer 13A has a base layer (hereinafter referred to as "first base layer") BL1 that has a different composition from that of the n-type semiconductor layer 12. The first base layer BL1 has a groove (hereinafter referred to as "first groove") GR1 formed to have a random net shape due to stress strain from the n-type semiconductor layer 12. In other words, the first groove GR1 has a mesh shape formed by a plurality of combined grooves created by stress (strain) generated in the first base layer BL1 due to the composition difference between the n-type semiconductor layer 12 and the first base layer BL1. The stress strain generated in the first base layer BL1 is strain of the crystal structure of the first base layer BL1 caused by the lattice constant difference between the n-type semiconductor layer 12 and the first base layer BL1.

The first light-emitting layer 13A has a quantum well structure layer (hereinafter referred to as "first quantum well structure layer") composed of a first quantum well layer WA formed on the first base layer BL1 and a first barrier layer BA. The first quantum well layer WA is formed on the first base layer BL1, and the first barrier layer BA is formed on the first quantum well layer WA. The first base layer BL1 functions as a barrier layer for the first quantum well layer WA. The first quantum well layer WA is formed as a strained quantum well layer.

A description will now be given of the first base layer BL1 with reference to FIG. 1(b). FIG. 1(b) is a diagram schematically illustrating the upper surface of the first base layer BL1. The first base layer BL1 is partitioned by the first groove GR1 and has many fine base segments (hereinafter referred to as "first base segment") BS formed to have random sizes. Each of the first base segments BS1 is partitioned in a random net shape since the first base layer BL1 has a composition subject to stress strain from the n-type semiconductor layer 12.

The first groove GR1 is composed of groove portions with random and different lengths and shapes. The first groove GR1 is formed in a net (mesh) shape all over the surface of the first base layer BL1. Each of the first base segments BS1 is a portion (segment) that is randomly partitioned and formed by the first groove GR1 within the first base layer BL1. Furthermore, the upper surface of each of the first base segments BS1 has various shapes, such as a substantially round shape, a substantially oval shape, and a polygonal shape.

The first groove GR1 has, for example, a V-shaped cross section (FIG. 1(a)). Also, as illustrated in FIG. 1(b), the first groove GR1 has a line-like bottom portion BP1. In this embodiment, an end portion of each of the first base segments BS1 is the bottom portion BP1 of the first groove GR1. Each of the first base segments BS1 adjoins another first base segment BS1 at the bottom portion BP1.

Further, the first base layer BL1 has a flat portion (hereinafter referred to as "first flat portion") FL1, which corresponds to each of the first base segments BS1. The surface of the first base layer BL1 is composed of the first flat portion FL1 and the inner wall surface of the first groove GR1. Each of the first flat portions FL1 is partitioned by the first groove GR1 for each first base segment BS1. The first base segment BS1 has an upper surface composed of the first flat portion FL1 and side surfaces composed of the inner wall surfaces of the first groove GR1.

In other words, the first flat portion FL1 constitutes the upper surface of each of the first base segments BS1, and the inner wall surface of the first groove GR1 constitutes the side surface of the first base segment BS1. Each of the first base segments BS1 thus has an inclined side surface and has a cross section with, for example, a substantially trapezoidal shape.

The first quantum well layer WA is formed to inherit (retain) the shape of the first groove GR1 on its surface. Also the first quantum well layer WA has a groove (hereinafter referred to as "second groove") GR2 that has the same mesh shape as that of the first groove GR. Specifically, as illustrated in FIG. 1(a), the first quantum well layer WA retains the segment shape of the first base segment BS1 and is formed on the first base layer BL1. Accordingly, the first quantum well layer WA has the second groove GR2 at a location corresponding to each groove portion of the first groove GR1 of the first base layer BL1.

As illustrated in FIG. 1(a), the first light-emitting layer 13A has a first barrier layer BA that has a flat surface (hereinafter referred to as "first flat surface") FS1 which is flattened by embedding the first base layer BL1 and the first quantum well layer WA. In other words, at the interface (bottom surface) with the first quantum well layer WA, the first barrier layer BA has an uneven shape corresponding to the second groove GR2. On the upper surface, the first barrier layer BA has a flat shape. Therefore, the surface of the first light-emitting layer 13A is formed as the flat surface FS1.

The second light-emitting layer 13B has a base layer (hereinafter, referred to as "second base layer") BL2 whose composition differs from that of the first barrier layer BA. The second base layer BL2 has a groove (hereinafter referred to as "third groove") GR3 formed to have a random net shape due to stress strain from the first barrier layer BA. In other words, the third groove GR3 has a mesh shape formed by a plurality of combined grooves created by stress (strain) which is generated on the second base layer BL2 due to the composition difference between the first barrier layer BA and the second base layer BL2.

The second light-emitting layer 13B has a quantum well structure layer (hereinafter referred to as "second quantum well structure layer") composed of the second quantum well layer WB formed on the second base layer BL2 and the second barrier layer BB. The second quantum well layer WB is formed on the second base layer BL2, and the second barrier layer BB is formed on the second quantum well layer WB. The second base layer BL2 serves as a barrier layer for the second quantum well layer WB. The second quantum well layer WB is formed as a strained quantum well layer.

The second base layer BL2 is partitioned by the third groove GR3 and has many fine base segments (hereinafter, referred to as "second base segments") BS2 formed to have random sizes. Each of the second base segments BS2 is partitioned into a random net shape since the second base layer BL2 has a composition subject to stress strain from the first barrier layer BA.

Each of the second base segments BS2 is a portion (segment) that is randomly partitioned and formed by the third groove GR3 within the second base layer BL2. Furthermore, the upper surface of each of the second base segments BS2 may have a various shape, such as a substantially round shape, a substantially oval shape, and a polygonal shape.

As illustrated in FIG. 1(a), the third groove GR3 is, for example, V-shaped and has a line-like bottom portion BP2. In this embodiment, an end portion of each of the second base segments BS2 is the bottom portion BP2 of the third groove GR3. Each of the second base segments BS2 adjoins another second base segment BS2 at the bottom portion BP2.

Also, the second base layer BL2 has a flat portion (hereinafter referred to as "second flat portion") FL2 corresponding to each of the second base segments BS2. The surface of the second base layer BL2 is composed of the second flat portion FL2 and the inner wall surface of the third groove GR3. Each of the second flat portion FL2 is partitioned by the third groove GR3 for each second base segment BS2. The second base segment BS2 has an upper surface composed of the second flat portion FL2 and a side surface composed of the inner wall surface of the third groove GR3.

The second quantum well layer WB is formed to inherit (retain) the shape of the third groove GR3 on its surface. Also, the second quantum well layer WB has a groove (hereinafter referred to as "fourth groove") GR4 that has the same mesh shape as that of the third groove GR3. Specifically, as illustrated in FIG. 1(a), the second quantum well layer WB is formed on the second base layer BL2 with the segment shape of the second base segment BS2 unchanged. Accordingly, the second quantum well layer WB has the fourth groove GR4 at a location corresponding to each groove portion of the third groove GR3 of the second base layer BL2.

As illustrated in FIG. 1(a), the second light-emitting layer 13B has the second barrier layer BB that has a flat surface (hereinafter referred to as "second flat surface") FS2 flattened by embedding the second base layer BL2 and the second quantum well layer WB. More specifically, the second barrier layer BB has an uneven shape corresponding to the fourth groove GR4 at the interface (lower surface) with the second quantum well layer WB. On the upper surface, the second barrier layer BB has a flat shape.

Accordingly, the surface of the second light-emitting layer 13A is formed as the flat surface FS2.

The third groove GR3 of the second base layer BL2 is formed at a location that is unrelated to the first groove GR1 of the first base layer BL1. The second bottom portion BP2 of the third groove GR3 is formed at a location that is unrelated to the first bottom portion BP1. Thus, the second base segment BS2 is formed at a location and have a size that is unrelated to the first base segment BS1. Thus, the fourth groove GR4 is formed at a location and has a size and a shape that are unrelated to the second groove GR2.

Figure 2:
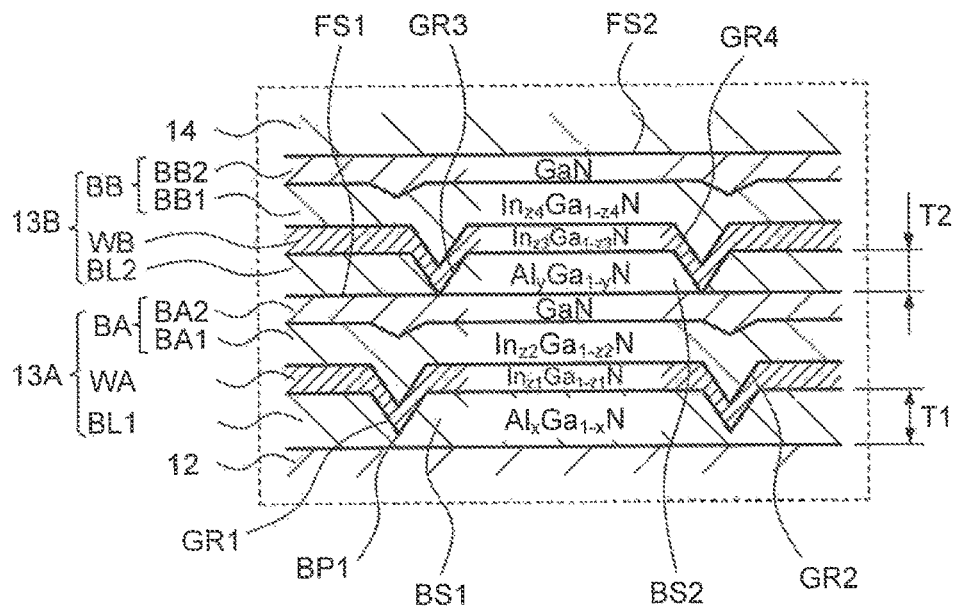
FIG. 2 is a cross-sectional view illustrating a structure of a light-emitting functional layer of the semiconductor light-emitting element according to the first embodiment.

FIG. 2 is a cross-sectional view illustrating the structure of the light-emitting functional layer 13. FIG. 2 is a partially enlarged cross-sectional view of the portion of FIG. 1(a) surrounded by the dashed line. With reference to FIG. 2, a description will be given in detail of the first and second light-emitting layers 13A and 13B of the light-emitting functional layer 13. In the first light-emitting layer 13A, the first base layer BL1 has a composition of $Al_xGa_{1-x}N$ ($0<x\le1$). The first quantum well layer WA has a composition of $In_{z1}Ga_{1-z1}N$ ($0<z1\le1$).

The first barrier layer BA has a first sub-barrier layer BA1 and a second sub-barrier layer BA2. In other words, the first barrier layer BA is of a double-layer structure. The second sub-barrier layer BA2 is formed to be closer to the p-type semiconductor layer 15 than the first sub-barrier layer BA1 is. More specifically, the first sub-barrier layer BA1 is formed on the first quantum well layer WA, and the second sub-barrier layer BA2 is formed on the first sub-barrier layer BA1. The second light-emitting layer 13B (second base layer BL2) is formed on the second sub-barrier layer BA2.

The first sub-barrier layer BA1 has a composition of $In_{z2}Ga_{1-z2}N$ ($0<z2\le1$). The second sub-barrier layer BA2 has the same composition as those of the n-type semiconductor layer 12 and the p-type semiconductor layer 15 and has a GaN composition in this embodiment. The In composition z2 of the first barrier layer BA1 is smaller than the In composition z1 of the first quantum well layer WA.

In the second light-emitting layer 13B, the second base layer BL2 has a composition of $Al_yGa_{1-y}N$ ($0<y\le1$). The second quantum well layer WB has a composition of $In_{z3}Ga_{1-z3}N$ ($0<z3\le1$).

The second barrier layer BB has a third sub-barrier layer BB1 and a fourth sub-barrier layer BB2. In other words, the second barrier layer BB is of a double-layer structure. The fourth sub-barrier layer BB2 is located closer to the p-type semiconductor layer 15 than the third sub-barrier layer BB1 is. More specifically, the third sub-barrier layer BB1 is formed on the second quantum well layer WB, and the fourth sub-barrier layer BB2 is formed on the third sub-barrier layer BB1. The electron blocking layer 14 is formed on the fourth sub-barrier layer BB2.

The third sub-barrier layer BB1 has a composition of $In_{z4}Ga_{1-z4}N$ ($0<z4\le1$). The fourth sub-barrier layer BB2 has the same composition as those of the n-type semiconductor layer 12 and the p-type semiconductor layer 15 and has a composition of GaN in this embodiment. The In composition z4 of the fourth sub-barrier layer BB2 is smaller than the In composition z3 of the second quantum well layer WB.

The layer thicknesses of the first base layer BL1 and the second base layer BL2 are different from each other. In this embodiment, the second base layer BL2 has a layer thickness T2, which is smaller than the layer thickness of the first base layer BL1. Specifically, the layer thickness T2 of the second base layer BL1 is smaller than the layer thickness T1 of the first base layer BL1.

In addition, the Al compositions of the first base layer BL1 and the second base layer BL2 are different from each other. More specifically, the Al composition x of the first base layer BL1 differs from the Al composition y of the second base layer BL2. In this embodiment, the Al composition y of the second base layer BL2 is greater than the Al composition x of the first base layer BL1. As the Al compositions x and y increase, the number, depth, and size of their groove portions increase, and the average size of the formed base segments decreases. In this embodiment, the average size of the base segment thus differs between the first and second base layers BL1 and BL2. The first and second base layers BL1 and BL2 function as barrier layers for the first and second quantum well layers WA and WB, respectively.

Hereinafter, a description will be given of the first and second light-emitting layers 13A and 13B. In the first and second base layers BL1 and BL2, the first and second base segments BS1 and BS2 can be formed by growing an AlGaN layer with a relatively large Al composition at a comparatively low temperature on a GaN layer as the n-type semiconductor layer 12 and the second barrier layer BA. Since the first and second base segments BS1 and BS2 are formed in the same mechanism, a description will be hereinafter made for the first base segment BS1.

First, when a first base layer BL1 different from the n-type semiconductor layer 12 in terms of crystal composition is grown on the n-type semiconductor layer 12, stress (strain) is generated in the first base layer BL1. For example, the first base layer BL1 has a smaller lattice constant than that of the n-type semiconductor layer 12. For example, when an AlGaN layer serving as the first base layer BL1 is formed on a GaN layer serving as the n-type semiconductor layer 12, tensile strain is generated in the AlGaN layer due to the GaN layer. Thus, tensile stress is generated in the AlGaN layer during its growth. When the AlGaN layer is grown on the GaN layer, a groove is formed in the AlGaN layer at the beginning of or during its growth, and the AlGaN layer grows in a three-dimensional manner. Accordingly, the AlGaN layer is grown in a stereoscopic manner, and a plurality of fine protrusions and recesses are formed. The starting point of formation of this groove is the first bottom portion BP1 of the first groove GR1.

When the AlGaN layer is grown on the GaN layer at a low temperature, three-dimensional growth of the AlGaN layer is promoted. Thus, a large number of groove portions are formed (the first groove GR1 is formed) on the surface of the AlGaN layer while being combined with each other, whereby the surface of the AlGaN layer is partitioned into a plurality of segments. The first base layer BL1 with the first base segments BS1 can thus be formed. In this embodiment, the AlGaN layer is formed as the first base layer BL1 at a growth temperature of 1100° C.

When an InGaN layer serving as the first quantum well layer WA is formed on the first base layer BL1, the first quantum well layer WA is formed as a strained quantum well layer. Further, a certain distribution of the In content is generated within the first quantum well layer WA. In other words, the first quantum well layer WA is formed such that, for example, the region on the first flat portion FL1 differs from the region on the first groove GR1 in terms of In composition. The layer thickness of the first quantum well layer WA on the upper surface of the first base segment BS1 is different from that on the side surface of the first base segment BS1. Thus, the band gap is not constant within the layer of the first quantum well layer WA.

The first quantum well layer WA with island-shaped fine protrusions and recesses thus formed emits light at various wavelengths due to the random shapes and band gap structure thereof. The segment shape ends at the first barrier layer BA. On the first barrier layer BA, the second base layer BL2 is formed to be unrelated to the first base layer BL1.

For example, the second base layer BL2 has a smaller lattice constant than that of the first barrier layer BA. Accordingly, tensile strain is exerted on the second base layer BL2 by the first barrier layer BA. In this embodiment, the second base layer BL2 is formed such that the Al composition y and the layer thickness T2 differ from those of the first base layer BL1. The average size (area) of the second base segment BS2 within the plane of the second base layer BL2 is different from that of the first base segment BS1 within the surface of the first base layer BL1. The in-layer In distribution differs between the first and second quantum well layers WA and WB, and the first and second quantum well layers WA and WB emit light in different wavelength regions.

In other words, by stacking a plurality of light-emitting layers (first and second light-emitting layers 13A and 13B) that have a barrier layer with a flattened upper surface as in the case of this embodiment, a light-emitting layer with an arbitrary light-emitting wavelength can be readily formed.

In this embodiment, each of the first and second light-emitting layers 13A and 13B emits light whose intensity peaks in a region on the longer wavelength side with reference to the blue region. Also, the first light-emitting layer 13A emits light whose peak is on the shorter wavelength side with respect to the second light-emitting layer 13B. As the first light-emitting layer 13A has fine island-shaped protrusions and recesses, it emits various colors of light. Specifically, as the size of the base segment decreases, the amount of In introduced into the quantum well layer increases, and the light-emitting wavelength shifts toward the longer wavelength side.

In this embodiment, the first base layer BL1 has the first flat portion FL1, and the surface of the first light-emitting layer 13A has the flat surface FS1. Since the second light-emitting layer 13B is formed on the first flat surface FS1, a preferable level of crystallinity is ensured at the interface between first and second light-emitting layers 13A and 13B.

As the first barrier layer BB has a double-layer structure composed of the first and second sub-barrier layers BA1 and BA2, the second groove GR2 of the first quantum well layer WA can be readily embedded, and the first flat surface FS1 is stably formed. Specifically, between an InGaN layer serving as the first quantum well layer WA and a GaN layer serving as the second sub-barrier layer BA2, the first sub-barrier layer BA1 (InGaN layer with a smaller In composition than that of the first quantum well layer WA) whose lattice constant is between those of the aforementioned InGaN and GaN layers is interposed. As a result, the groove is surely embedded, and the shape of the flat surface FS1 is stably formed.

If the second groove GR2 is flattened, the first barrier layer BA may be composed of a GaN layer only. In other words, the first sub-barrier layer BA1 does not need to be formed. For example, the first flat surface FS1 can be formed by forming a GaN layer so that its layer thickness is relatively large. The foregoing applies to the second barrier layer BB as well. The flat surfaces FS1 and FS2 need to be formed by completely embedding a groove in the upper surfaces of the first and second barrier layers BA and BB. Specifically, in an example case where the first and second barrier layers BA and BB constitute a double-layer structure, the surface of the sub-barrier layer closest to the p-type semiconductor layer 15 needs to be formed as a flat surface. For example, as illustrated in FIG. 2, in the surfaces of the first and third sub-barrier layers BA1 and BB1, grooves corresponding to the second and fourth grooves GR2 and GR2 may be formed (or retained), respectively.

The case of forming the surface of the second light-emitting layer 13B as a flat surface (second flat surface FS2) has been illustrated in this embodiment. However, this embodiment is not limited to the case where the surface of the second light-emitting layer 13B is formed as a flat surface. The surface of the second light-emitting layer 13B may have a groove corresponding to the fourth groove GR4. Taking into consideration the crystallinity on the interface between the second light-emitting layer 13B and the electron blocking layer 14, it is desired that the second light-emitting layer 13B have a flattened upper surface.

In this embodiment, the case where the surfaces of the first and second base layers BL1 and BL2 and the first and second quantum well layers WA and WB are composed of a flat portion and a groove has been illustrated. However, the shapes of these surfaces are not limited to the aforementioned case. For example, the first base layer BL1 may have a curved surface portion on the upper surface of the first base segment BS1.

The In composition z1 and In composition z3 of the first and second quantum well layers WA and WB may be either identical or different. Specifically, as described above, the average size of each base segment can be varied by changing the layer thicknesses and Al compositions of the first and second base layers BL1 and BL2, whereby the light-emitting wavelength regions of the first and second light-emitting layers 13A and 13B can be adjusted. In addition, the In compositions of the first and second quantum well layers WA and WB can be adjusted to adjust their respective light-emitting wavelengths. In this embodiment, the first and second quantum well layers WA and WB are configured so that the In composition z1 and In composition z3 are identical.

As the sizes of the base segments BS1 and BS2 decrease, the amount of In introduced into the quantum well layers WA and WB increases, and the light-emitting wavelength shifts toward the longer wavelength side. Specifically, when an InGaN layer as the quantum well layer WA is formed on an AlGaN layer serving as the base layer BL1, the AlGaN layer exerts compressive stress (compressive strain) on the InGaN layer. When the InGaN layer is subject to compressive strain, In is readily introduced into the first quantum well layer WA. It is considered that the band gap of the InGaN layer, i.e., the energy between quantum levels, thereby decreases. Therefore, as the segment shapes of the base layers BL1 and BL2 decrease, the first quantum well layer WA emits light containing more components whose wavelengths are on the longer wavelength side.

Also, the present inventors examined formation of not a light-emitting layer like the first or second light-emitting layer 13A or 13B, but of a multiple quantum well structure having a plurality of quantum well layers which have one flat surface and in which the In composition is changed differently from one another. However, the range of the In composition that can be formed is limited. In the case of a light-emitting element having a light-emitting layer of a multiple quantum well structure with In compositions changed, the spectrum with a wavelength band as wide as that of the light-emitting element 10 of this embodiment was not possible. Specifically, light with a constant wavelength and a certain level of intensity in a wide range was not acquired.

Accordingly, light with high color rendering properties could not be acquired by simply increasing the In composition. When a quantum well layer with an excessively large In composition was formed to change the In composition in a wide range, segregation of In was noticeable, and In precipitated and blackened. Also, a portion that does not function as a light-emitting layer was formed. Thus, it can be said that there is a limit in the effort to simultaneously achieve a wider light-emitting spectrum and a higher light-emitting intensity based on the In composition.

In another example consideration, the present inventors manufactured a light-emitting element by laminating light-emitting layers that are formed of different materials and have different band gaps. Simply laminating light-emitting layers of different types of materials only produced light whose peak wavelength corresponds to the band gap, and the spectral intensity between the peaks was small. Acquisition of white light was difficult as colors were mixed in an unbalanced and unstable manner. A step of forming light-emitting layers containing different types of materials was added, and the resulting product did not have a preferable level of crystallinity. In this embodiment, on the other hand, by forming a light-emitting functional layer 13 having a first quantum well layer WA of a microstructure, light that has a light-emitting wavelength band (or half-width) in a wide range of the visible region was readily and certainly achieved.

As one example embodiment, the present inventors formed the light-emitting functional layer 13 with the following layer thicknesses: The first base layer BL1 has a layer thickness of 8 nm. The first quantum well layer WA has a layer thickness of 5.5 nm. The size (area) of the base segment BS in the in-plane direction ranges from several hundreds $nm^2$ to several $\mu m^2$.

In this embodiment, 4 μm of an n-GaN layer was formed as the n-type semiconductor layer 12 at a growth temperature of 1225° C. The first and second quantum well layers WA and WB were formed at a growth temperature of 845° C. Also, an AlGaN layer serving as the electron blocking layer 14 was formed at a growth temperature of 1000° C., and a p-GaN layer serving as the p-type semiconductor layer 15 was formed at a growth temperature of 1100° C.

In this embodiment, the case where each of the first and second quantum well layers WA and WB has a quantum well structure has been illustrated. However, each of the first and second quantum well layers WA and WB may be a single quantum well layer or may be of a multiple quantum well structure composed of a plurality of quantum well layers and barrier layers. In other words, each of the first and second light-emitting layers 13A and 13B (first and second quantum well structure layers) may be of a single quantum well (SQW) structure or a multiple quantum well (MQW) structure. When the first and second light-emitting layers 13A and 13B are of a multiple quantum well structure, the barrier layer located closest to the p-type semiconductor layer 15 needs to have a flat surface.

Modified Example

Figure 3:
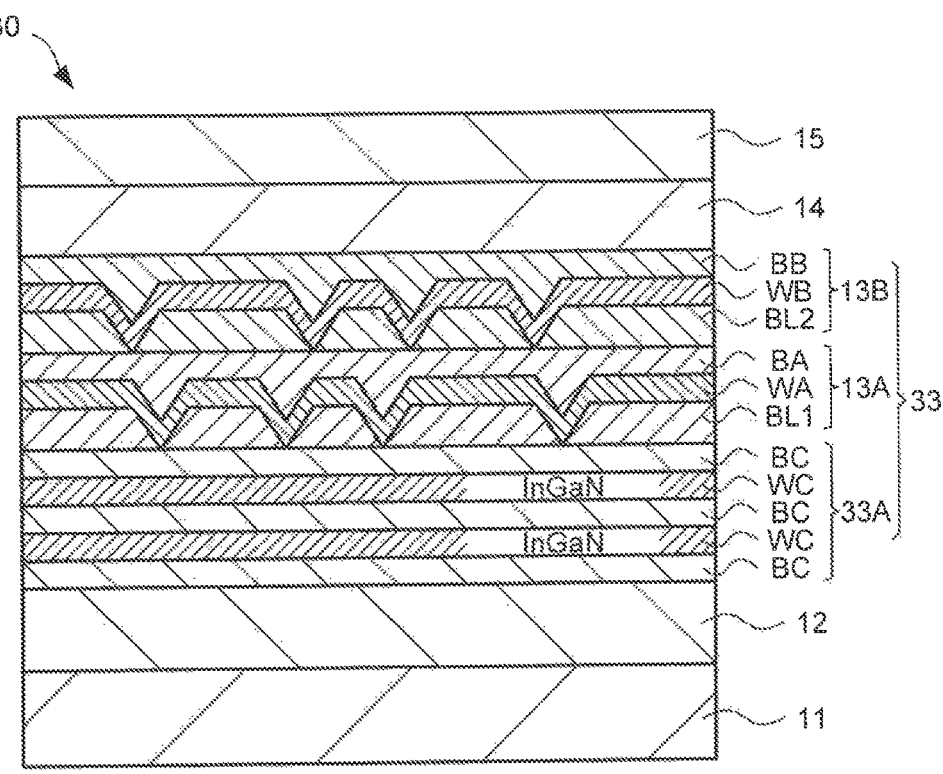
FIG. 3 is a cross-sectional view illustrating a structure of a semiconductor light-emitting element according to a modified example of the first embodiment.

FIG. 3 is a cross-sectional view illustrating the structure of a semiconductor light-emitting element 30 according to a modified example of the first embodiment. Except for the structure of the light-emitting functional layer 33, the configuration of the light-emitting element 30 is the same as that of the light-emitting element 10. Between the n-type semiconductor layer 12 and the first light-emitting layer 13A of the light-emitting element 10, the light-emitting functional layer 33 of the light-emitting element 30 has a third light-emitting layer 33A. The third light-emitting layer 33A is of a quantum well structure composed of at least one third quantum well layer WC and a plurality of third barrier layers WC.

According to this modified example, in the structure of the third light-emitting layer 33A, two third quantum well layers WC and three third barrier layers BC are alternately laminated on the n-type semiconductor layer 13. On the third barrier layer BC, which is located closest to the p-type semiconductor layer 15, the first light-emitting layer 13A (first base layer BL1) is formed. Each of the third quantum well layers WC is a uniformly flat layer that has an identical composition to, for example, the composition of one of the first and second quantum well layers WA and WB, e.g., an InGaN composition. Each of the third barrier layers BC has the same composition as those of the first and second barrier layers BA and BB, e.g., a GaN layer or a double-layer structure containing InGaN and GaN layers. The third barrier layer BC located closest to the first light-emitting layer 13A of the third barrier layers BC has the same composition as that of the n-type semiconductor layer 12.

In the configuration of this modified example, the third light-emitting layer 33A of a quantum well structure is added to the side of the n-type semiconductor layer 12 of the light-emitting functional layer 13 of the light-emitting element 10 according to the first embodiment. Compared with the first embodiment, additional light with a light-emitting wavelength peak in a pure blue region can be emitted. The configuration according to this modified example is advantageous for, for example, increasing the light intensity in the blue region.

In this modified example, the case of forming the third light-emitting layer 33A between the n-type semiconductor layer 12 and the first light-emitting layer 13A has been illustrated. However, the location where the third light-emitting layer 33A is formed is not limited to the aforementioned case. For example, the third light-emitting layer 33A may be formed on the second light-emitting layer 13B, i.e., between the second light-emitting layer 13B and the p-type semiconductor layer 15. Also, the third light-emitting layer 33A may be formed between the first and second light-emitting layers 13A and 13B.

Figure 4:
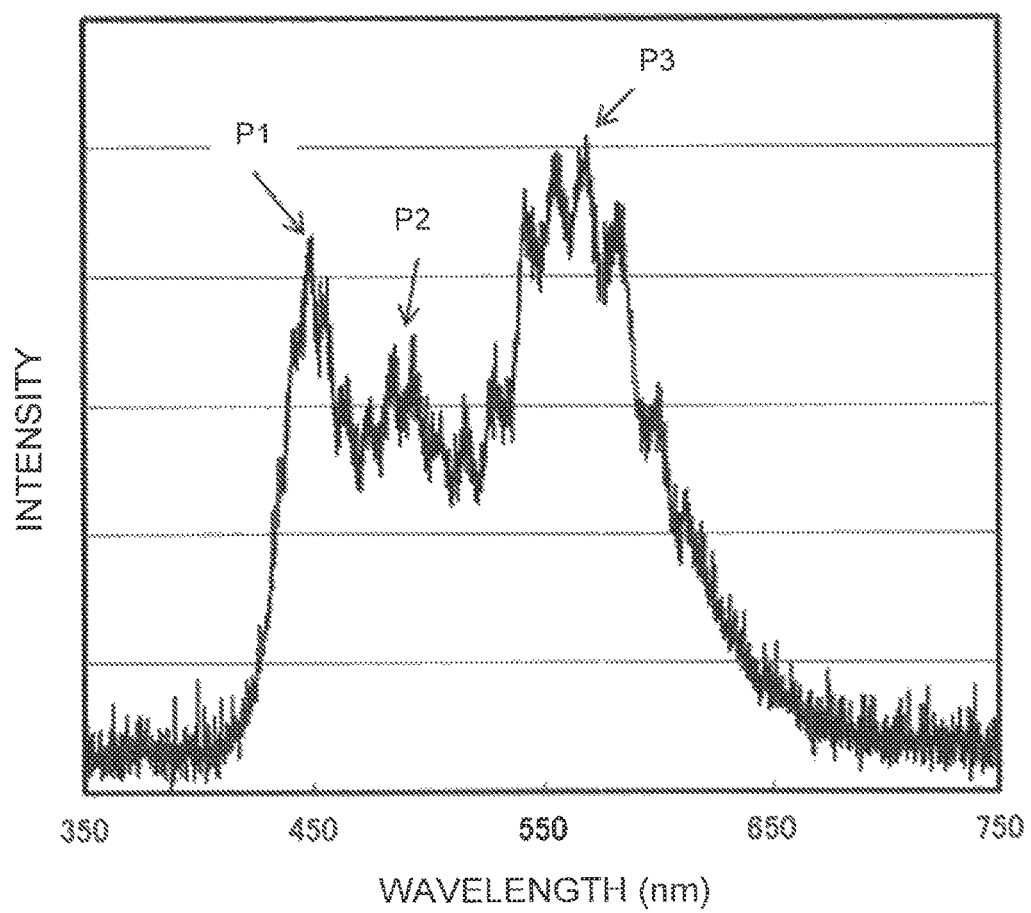
FIG. 4 is a diagram illustrating an emission spectrum from the semiconductor light-emitting element according to the modified example of the first embodiment.

FIG. 4 illustrates the spectral characteristics of light emitted from the light-emitting element 30. In the drawing, the horizontal axis represents the wavelength, and the vertical axis represents the light-emitting intensity. As illustrated in FIG. 4, the light emitted from the light-emitting element 30 has three peaks and has a high intensity substantially over the entire visible region. Of the three peaks, a peak P1 at approximately 450 nm, which is located closest to the short wavelength side, is produced by light emitted from the third light-emitting layer 33A. Likewise, a peak P2 at approximately 500 nm and a peak P3 at approximately 570 nm are produced by light emitted from the first and second light-emitting layers 13A and 13B, respectively. When the third light-emitting layer 33A is not provided, i.e., when the light-emitting element 10 is used, spectral characteristics identical to that of the light-emitting element 30 is achieved except for absence of the peak P1.

In this embodiment, the case of laminating two light-emitting layers with an island-shaped base segment has been illustrated. However, three or more light-emitting layers with the same configurations as those of the first and second light-emitting layers 13A and 13B may be laminated. In other words, the light-emitting functional layers 13 and 33A need to have a structure in which at least the first and second light-emitting layers 13A and 13B are stacked.

The case of forming the electron blocking layer 14 between the light-emitting functional layer 13 (or 33) and the p-type semiconductor layer 15 has been illustrated in this embodiment. However, this embodiment is not limited to the case of providing the electron blocking layer 14. For example, the p-type semiconductor layer 15 may be formed on the light-emitting functional layer 13. Note that the electron blocking layer 14 has a larger band gap than those of the n-type semiconductor layer 12, the light-emitting functional layer 13, and the p-type semiconductor layer 15. Accordingly, electrons can be prevented from overflowing to the side of the p-type semiconductor layer 15 through the light-emitting functional layer 13. Therefore, it is preferable to provide the electron blocking layer 14 for large-current driving and high-temperature operation.

As described above, the first base segment BS1 of the first light-emitting layer 13A and the second base segment BS2 of the second light-emitting layer 13B are randomly formed so that they are unrelated to each other. Therefore, the respective light emission ranges are different from one another and the respective emitted light therefrom are overlapped to yield a light emission having a wide range. The first base layer BL1 and the second base layer BL2 are made so as to differentiate the average sizes of their segments, whereby light emitted from the first light-emitting layer 13A and light from the second light-emitting layer 13B can be differentiated (wavelength bands can be differentiated). By configuring the first and second base layers BL1 and BL2 so that their layer thicknesses are different, the spectral widths of light emitted from the first light-emitting layer 13A and light emitted from the second light-emitting layer 13B differ from each other.

According to the embodiment and the modified example thereof, in the structure of the light-emitting functional layer 13, a plurality of light-emitting layers, including the first and second light-emitting layers 13A and 13B, are laminated. The first light-emitting layer 13A has: the first base layer BL1 that has a composition subject to stress strain from the n-type semiconductor layer 12 and has a plurality of first base segments BS1 partitioned into a random net shape; the first quantum well layer WA that retains the segment shape of the first base segment BS1 and is formed on the first base layer BL1; and the first barrier layer BA that has the flat surface FS1 flattened by embedding the first base layer BL1 and the first quantum well layer WA.

The second light-emitting layer 13B has: the second base layer BL2 that has a composition subject to stress strain from the first barrier layer BA and has a plurality of second base segments BS2 partitioned into a random net shape; the second quantum well layer WB that retains the segment shape of the second base segment BS2 and is formed on the second base layer BL2; and the second barrier layer BB formed on the second quantum well layer WB. Accordingly, it is possible to provide a light-emitting element that can emit light with a high light-emitting intensity over a wide range of the visible region.

In this embodiment, the case where the first conductivity type is an n-conductivity type and the second conductivity type is a p-conductivity type, which is opposite to the n-conductivity type. However, the first conductivity type may be a p-type, and the second conductivity type may be an n-type.

REFERENCE NUMERALS LIST 10, 30 semiconductor light-emitting element
12 n-type semiconductor layer (first semiconductor layer)
13, 33 light-emitting functional layer
13A first light-emitting layer
13B second light-emitting layer
33A third light-emitting layer
14 electron blocking layer
15 p-type semiconductor layer (second semiconductor layer)
BL1 first base layer
BS1 first base segment
BL2 second base layer
BS2 second base segment
GR1 to GR4 first to fourth grooves
FS1 first flat surface
FS2 second flat surface

The invention claimed is:

1. A semiconductor light-emitting element comprising:
    a first semiconductor layer of a first conductivity type;
    a light-emitting functional layer that is formed on the first semiconductor layer and includes first and second light-emitting layers; and
    a second semiconductor layer that is formed on the light-emitting functional layer and is of a conductivity type opposite to the conductivity type of the first semiconductor layer,
    wherein the first light-emitting layer includes:
        a first base layer that has a composition subject to strain from the first semiconductor layer and has a plurality of first base segments each having an island-shape, the plurality of first base segments being partitioned by first groove portions with random groove lengths into a random net shape, and the plurality of first base segments having random-shaped upper surfaces and having side surfaces which are inner wall surfaces of the first groove portions;
        a first quantum well layer that retains segment shapes of the plurality of first base segments and is formed on the upper surfaces and the side surfaces of the plurality of first base segments of the first base layer, the first quantum well layer having second groove portions which have same shapes as those of the first groove portions; and
        a first barrier layer that has an uneven shape corresponding to the second groove portions at an interface of the first barrier layer with the first quantum well layer and has a flat surface flattened by embedding the first base layer and the first quantum well layer,
    wherein the second light-emitting layer is formed on the flat surface of the first barrier layer, and
    wherein the second light-emitting layer includes:
        a second base layer that has a composition subject to strain from the first barrier layer and has a plurality of second base segments each having an island-shape, the plurality of second base segments being partitioned by third groove portions with random groove lengths into a random net shape, the third groove portions being unrelated to the first groove portions, and the plurality of second base segments having random-shaped upper surfaces and having side surfaces which are inner wall surfaces of the third groove portions;
        a second quantum well layer that retains segment shapes of the plurality of second base segments and is formed on the upper surfaces and the side surfaces of the plurality of second base segments of the second base layer, the second quantum well layer having fourth groove portions which have same shapes as those of the third groove portions; and a second barrier layer formed on the second quantum well layer, the second barrier layer having an uneven shape corresponding to the fourth groove portions at an interface of the second barrier layer with the second quantum well layer.

2. The semiconductor light-emitting element according to claim 1, wherein layer thicknesses of the first and second base layers are different from each other.

3. The semiconductor light-emitting element according to claim 1, wherein the plurality of second base segments have an average size in a plane of the second base layer different from an average size of the plurality of first base segments in a plane of the first base layer.

4. The semiconductor light-emitting element according to claim 1, wherein:
the first semiconductor layer has a GaN composition,
each of the first and second base layers has an AlN or AlGaN composition, and
Al compositions of the first and second base layers are different from each other.

5. The semiconductor light-emitting element according to claim 4, wherein:
each of the first and second quantum well layers has an InGaN composition;
the first barrier layer includes:
a first sub-barrier layer that is formed on the first quantum well layer and is composed of InGaN whose In composition is smaller than that of the first quantum well layer; and
a second sub-barrier layer that is formed on the first sub-barrier layer and is composed of GaN; and
the second sub-barrier layer has the flat surface.

6. The semiconductor light-emitting element according to claim 4, wherein an Al composition of the second base layer is greater than an Al composition of the first base layer.

7. The semiconductor light-emitting element according to claim 1, wherein:
the light-emitting functional layer has a third light-emitting layer that has at least one third quantum well layer and a plurality of third barrier layers between the first semiconductor layer and the first light-emitting layer; and
a third barrier layer located closest to the first light-emitting layer of the plurality of third barrier layers has an identical composition to a composition of the first semiconductor layer.

8. The semiconductor light-emitting element according to claim 1, wherein:
the second barrier layer has a flat surface;
an electron blocking layer comprising AlGaN is formed on the flat surface of the second barrier layer; and
the second semiconductor layer is formed on the electron blocking layer.

9. The semiconductor light-emitting element according to claim 1, wherein:
each of the first groove portions is V-shaped and has a line-like bottom portion;
end portions of the first base segments are the bottom portions of the first groove portions;
each of the third groove portions is V-shaped and has a line-like bottom portion; and
end portions of the second base segments are the bottom portions of the third groove portions.

10. The semiconductor light-emitting element according to claim 1, wherein the first and second quantum well layers emit light in different wavelength regions.

11. The semiconductor light-emitting element according to claim 1, wherein the first light-emitting layer emits light whose peak is on a shorter wavelength side with respect to the second light-emitting layer.

12. The semiconductor light-emitting element according to claim 1, wherein the upper surfaces of the plurality of first base segments are flat surfaces.

13. The semiconductor light-emitting element according to claim 1, wherein the first and second quantum well layers are InGaN layers having a same In composition.

14. The semiconductor light-emitting element according to claim 1, wherein the first and second quantum well layers are InGaN layers having In compositions different from each other.

15. A semiconductor light-emitting element comprising:
a first semiconductor layer of a first conductivity type;
a light-emitting functional layer that is formed on the first semiconductor layer and includes first and second light-emitting layers; and
a second semiconductor layer that is formed on the light-emitting functional layer and is of a conductivity type opposite to the conductivity type of the first semiconductor layer,
wherein the first light-emitting layer includes:
a first base layer that has a composition subject to strain from the first semiconductor layer and has a plurality of first base segments partitioned into a random net shape;
a first quantum well layer that retains segment shapes of the plurality of first base segments and is formed on the first base layer; and
a first barrier layer that has a flat surface flattened by embedding the first base layer and the first quantum well layer,
wherein the second light-emitting layer includes:
a second base layer that has a composition subject to strain from the first barrier layer and has a plurality of second base segments partitioned into a random net shape;
a second quantum well layer that retains segment shapes of the plurality of second base segments and is formed on the second base layer; and
a second barrier layer formed on the second quantum well layer,
wherein the first semiconductor layer has a GaN composition,
wherein each of the first and second base layers has an AlN or AlGaN composition,
wherein each of the first and second quantum well layers has an InGaN composition,
wherein the first barrier layer includes:
a first sub-barrier layer that is formed on the first quantum well layer and is composed of InGaN whose In composition is smaller than that of the first quantum well layer; and
a second sub-barrier layer that is formed on the first sub-barrier layer and is composed of GaN, and
wherein the second sub-barrier layer has the flat surface.

16. The semiconductor light-emitting element according to claim 15, wherein Al compositions of the first and second base layers are different from each other.

* * * * *